(12) United States Patent
Nagao

(10) Patent No.: US 6,229,461 B1
(45) Date of Patent: May 8, 2001

(54) ENCODER AND DECODER

(75) Inventor: Fumiaki Nagao, Ibi-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/233,000

(22) Filed: Jan. 19, 1999

(30) Foreign Application Priority Data

Jan. 23, 1998 (JP) .................................. 10-011805
Jan. 23, 1998 (JP) .................................. 10-011806

(51) Int. Cl.[7] ...................................... H03M 7/02
(52) U.S. Cl. ................................. 341/83; 708/190
(58) Field of Search .................. 341/83, 50, 51, 341/81, 82, 89, 106; 708/190, 141, 230, 542, 604

(56) References Cited

U.S. PATENT DOCUMENTS

| 4,001,566 | * | 1/1977 | Stevenson | 708/190 |
| 4,100,602 | * | 7/1978 | Shapiro | 341/83 |
| 4,458,325 | * | 7/1984 | Nakata et al. | 341/83 |
| 5,642,111 | * | 6/1997 | Akagiri | 341/50 |
| 5,682,461 | * | 10/1997 | Silzle et al. | 704/205 |

* cited by examiner

Primary Examiner—Peguy JeanPierre
Assistant Examiner—Jean Bruner JeanGlaude
(74) Attorney, Agent, or Firm—Cantor Colburn LLP

(57) ABSTRACT

To encode data Y after separating the data Y into a scale factor SF, a word length, and a data value X. For this purpose, $X = Y \cdot \{2^{(WL-1)} - 1\}/SF$ is calculated. Here, a value of $\{2^{(WL-1)} - 1\}/SFV$ with respect to a number of SFV and a number of SL, which are obtained by separating into $SF = SF \cdot 2^{SFF}$, is stored in a ROM in advance. Then, input data Y is separated into a mantissa part Yr and an index part Ye and Ye is added to SFF. Then, the shifter 16 shifts Yr according to an additional result to obtain $Ye \cdot 2^{Ye} \cdot 2^{SFF}$. On the other hand, based on SF and WL, which are determined with respect to Y, a value of corresponding $\{2^{(WL-1)} - 1\}/SFV$ is read from the ROM. Then, the shifted result is multiplied by the output from the ROM to obtain a data value X. Also, $Y = SF \cdot X/\{2^{(WL-1)} - 1\}$ is calculated and decoded. Inputted SF is divided into SFV and SFF. Based on the obtained SFV and inputted WL, a value of corresponding $SFV/\{2^{(WL-1)} - \}$ is read from the ROM. SFF is given as an index value for the inputted X. The result with the index value given and the output from the ROM are multiplied in a multiplier to calculate Y to decode.

6 Claims, 4 Drawing Sheets

ENCODER AND DECODER

BACKGROUND OF THE INVENTION

1. Field of the Invention

The present invention relates to an encoder for dividing data Y into a scale factor SF, a word length WL, and a data value X and for encoding the divided data, and a decoder for decoding the encoded data Y to obtain decoded data Y.

2. Description of the Related Art

Conventionally, audio or image data is encoded into a compressed form for storage or transmission. One such data encoding methods may be one in which data is divided into a scale factor SF, a word length WL, and a data value X before encoding. With this method, a word length WL and a scale factor SF are obtained from the original value of data Y. Moreover, a data value X is also obtained from the Expression below.

$$X = Y \cdot \{2^{(WL-1)} - 1\}/SF$$

wherein the scale factor SF is divided into SFN and SFO based on the relationship expressed as $SF = 2^{(SPN/3 - SFO)}$.

Also, for decoding, the original value of data Y must be calculated using the inputted SFN, SFO, WL, and X, based on the following expressions.

$$Y = SF \cdot X / \{2^{(WL-1)} - 1\},$$

wherein $$SF = 2^{(SPY/3 - SFO)}$$

Conventionally, the above values are calculated by a microcomputer, or the like, using appropriate software.

However, such calculation using software may take time. In particular, when an MD (mini-disk) playback machine is used, it is preferable to use a single integrated circuit for the above decoding operation, and the entire circuit is therefore desired to have a simple structure and capable of high speed calculation. This leads to a demand for a hardware calculation circuit having a simple structure.

SUMMARY OF THE INVENTION

The present invention aims to provide an encoder and a decoder capable of the above calculations, and having a relatively small size circuitry structure.

According to an encoder of this invention, a scale factor SF is divided into an index value SFF and a mantissa value SFV. $\{2^{(WL-1)} - 1\}/SFV$, which is determined based on a mantissa value SFV and a word length WL, is stored in the ROM. With this arrangement, the number of values to be stored in the ROM can be reduced according to the number of values which the mantissa value SFV may be. This makes it possible to reduce the capacity of the ROM.

Also, according to a decoder of the invention, a scale factor SF is divided into an index value SFF and a mantissa value SFV. $\{2^{(WL-1)} - 1\}/SFV$, which is determined based on a mantissa value SFV and a word length WL, is stored in the ROM. With this arrangement, the number of values to be stored in the ROM can be reduced according to the number of values which the mantissa value SFV may be. This makes it possible to reduce the ROM capacity.

Preferably, a mantissa value SFV may be either 1, $2^{1/3}$, or $2^{2/3}$ so that $2^{(WL-1)} - 1$, $\{2^{(WL-1)} - 1\}/2^{1/3}$, and $\{2^{(WL-1)} - 1\}/2^{2/3}$ are stored in the ROM. Since there are only three values for a mantissa value SFV, a large capacity ROM is not required.

The encoder calculates $Y \cdot 2^{SFF}$ by shifting the bits of data Y. Since a calculation based on $2^{SFF}$ is a multiplication of $2^{-SFF}$ with respect to either data Y or an output from the ROM, such a calculation is achievable by shifting the bits of data Y according to an index value SFF. This enables reducing the number of multiplications to only one. Note that multiplication of an index value of data Y can be calculated through addition/subtraction with respect to an index value SFF and bit-shifting. This enables a high speed calculation to be made using a simple structure unit.

The decoder calculates $X \cdot 2^{SFF}$ by giving an index value to the data value X or shifting the bits of the data value X. A calculation based on $2^{SFF}$ is a multiplication with respect to either data X or an output from the ROM. This calculation, however, can be made, when data is handled as floating point data, by giving an index value SFF as an index value of data X. Also, when data is handled as fixed point data, the above calculation can be made by shifting data X according to an index value SFF. Therefore, the number of application of a multiplication can be reduced to only once. This makes it possible to achieve high speed calculation using a unit with a simple structure.

BRIEF DESCRIPTION OF THE DRAWINGS

The above and the other objects, features, and advantages of the present invention, will become further apparent from the following description of the preferred embodiments taken in conjunction with the accompanying drawings wherein.

DESCRIPTION OF THE PREFERRED EMBODIMENTS

In the following, preferred embodiments of the present invention will be described with reference to the accompanying drawings.

Embodiment 1.

Figure 1:
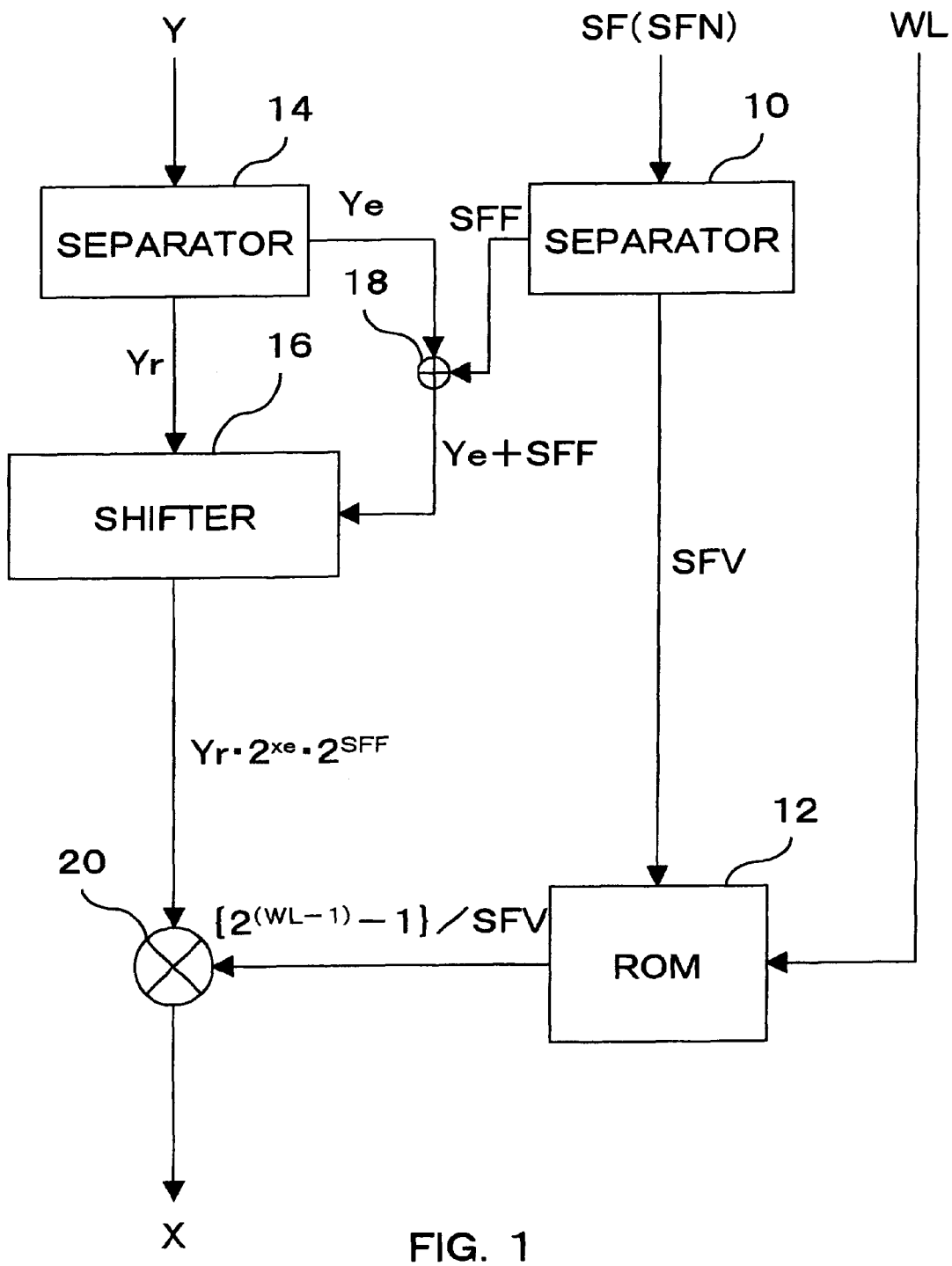
FIG. 1 is a block diagram showing a structure of an encoder according to first preferred embodiment.

FIG. 1 shows a structure of an encoder according to a first preferred embodiment of the present invention. In the first preferred embodiment, floating point data Y is input for processing.

That is, data Y is input for encoding. A scale factor SF and a word length WL are determined based on the data Y in a separate process.

The determined scale factor SF is input into a separator 10 to be divided into an mantissa value SFV representing a mantissa part of the scale factor SF and an index value SFF representing an index part thereof.

Based on the mantissa value SFV and the word length WL, an access address in a ROM 12 is designated, so that a value for $\{2^{(WL-1)} - 1\}/SFV$ is read from the ROM 12.

That is, the ROM 12 is loaded with the data shown in Table 1, and outputs a value corresponding to inputted SFV and WL.

TABLE 1

| | | SFV | | |
|---|---|---|---|---|
| | | 1.00 | $2^{1/3}$ | $2^{2/3}$ |
| WL | 0 | — | — | — |
| | 2 | 1 | $2^{1/3}$ | $2^{2/3}$ |
| | 3 | 1/3 | $2^{1/3}/3$ | $2^{2/3}/3$ |
| | 4 | 1/7 | $2^{1/3}/7$ | $2^{2/3}/7$ |

On the other hand, the data Y is supplied to the separator 14 to be divided into an index part Ye and a mantissa part Yr. The mantissa part Yr is supplied intact to a shifter 16, while the index part Ye is supplied to an adder 18. The adder 18, which also receives an index part SFF from the separator 10, calculates Ye+SFF. The adder 18 then supplies an output "Ye+SFF" to the shifter 16 as a control signal for controlling a bit shift extent (number of bit shift).

The shifter 16, therefore, outputs a signal "$Yr \cdot 2^{Ye} \cdot 2^{SFF}$".

Then, a signal $\{2^{(WL-1)}-1\}/SFV$, read from the ROM 12, and a signal "$Yr \cdot 2^{Ye} \cdot 2^{SFF}$", read from the shifter 16, are supplied to a multiplier 20 for multiplication, i.e., $$Yr \cdot 2^{Ye} \cdot 2^{SFF} \cdot \{2^{(WL-1)}-1\}/SFV$$

$$= Y \cdot \{2^{(WL-1)}-1\}/SF = X$$

The multiplier 20 then outputs a resultant data value X.

As described above, in this embodiment, a scale factor SF is divided into an index value SFF and a mantissa values SFV, and $\{2^{(WL-1)}-1\}/SFV$, which is determined by a mantissa value SFV and a word length WL, is stored in the ROM 12. This arrangement enables reduction of the number of values to be stored in the ROM 12, and thus the ROM 12 capacity accordingly. Also, basically, there are only three types for a mantissa part SFV, as shown in Table 1, the ROM does not need to have a very large capacity.

Further, when SFF is given to the shifter 16 as an extent by which the data Y is bit shifted, instead of a calculation regarding SFF. With this arrangement, the number of application of multiplication can be saved to only once, which resultantly enables high speed calculation by using a device with a simple structure.

Embodiment 2.

In a second preferred embodiment of the present invention, fixed point data Y is input for processing.

Figure 2:
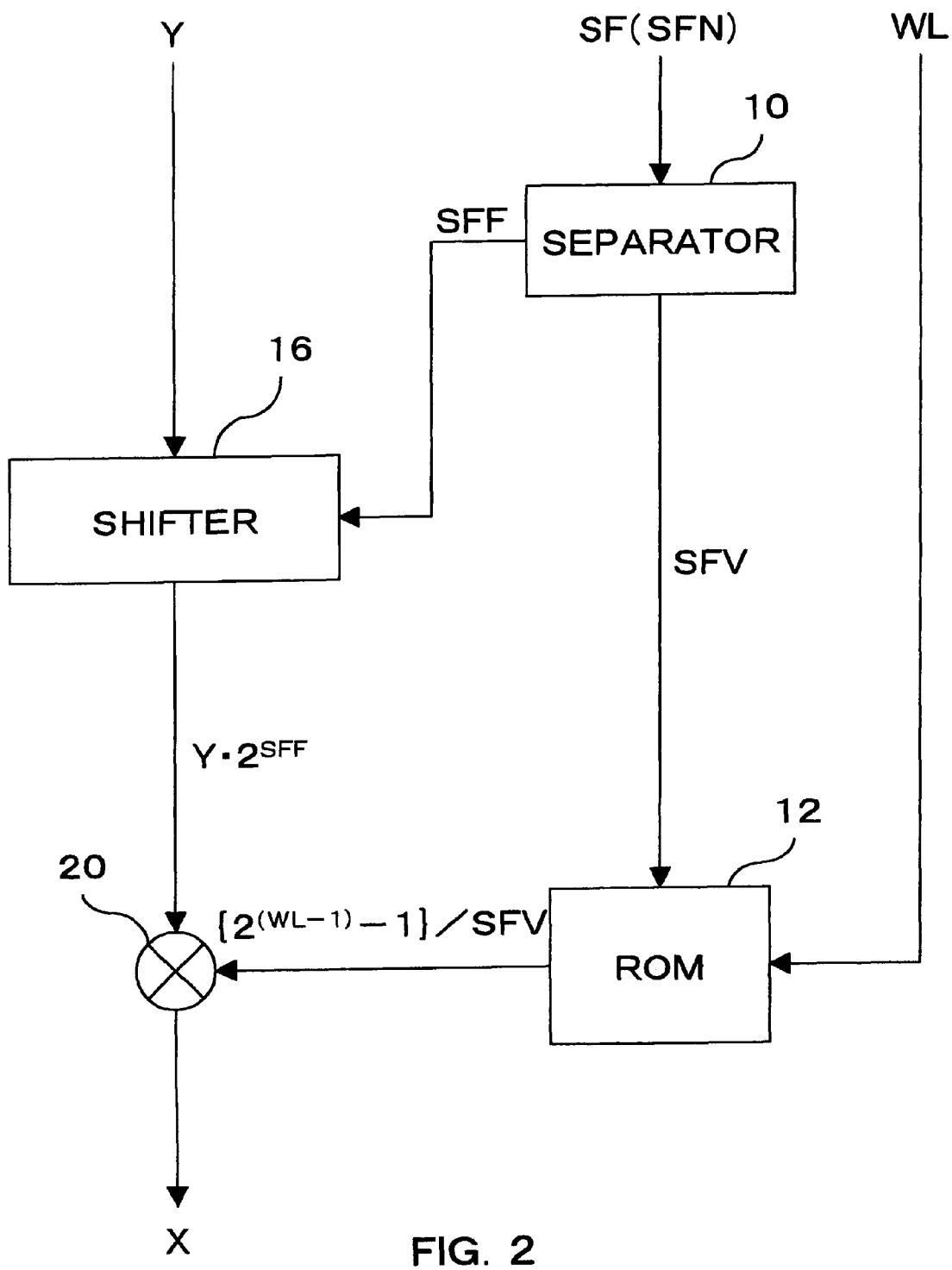
FIG. 2 is a block diagram showing a structure of an encoder according to a second preferred embodiment.

In this case, the separator 14 and the adder 18 are unnecessary, as shown in FIG. 2, since Y is fixed point data. The shifter 16 shifts data Y according to SFF to thereby calculate $Y \cdot 2^{SFF}$.

The capacity of the ROM 12 in this embodiment may be identical to that of the first embodiment, and multiplication may have to be carried on only once.

As described above, in an encoder of this embodiment, the capacity of ROM can be reduced and the number of multiplication can be saved to only once when index and mantissa parts of a scale factor SF are handled separately. This enables simplification of circuitry structure and improving calculation speed.

Embodiment 3.

Figure 3:
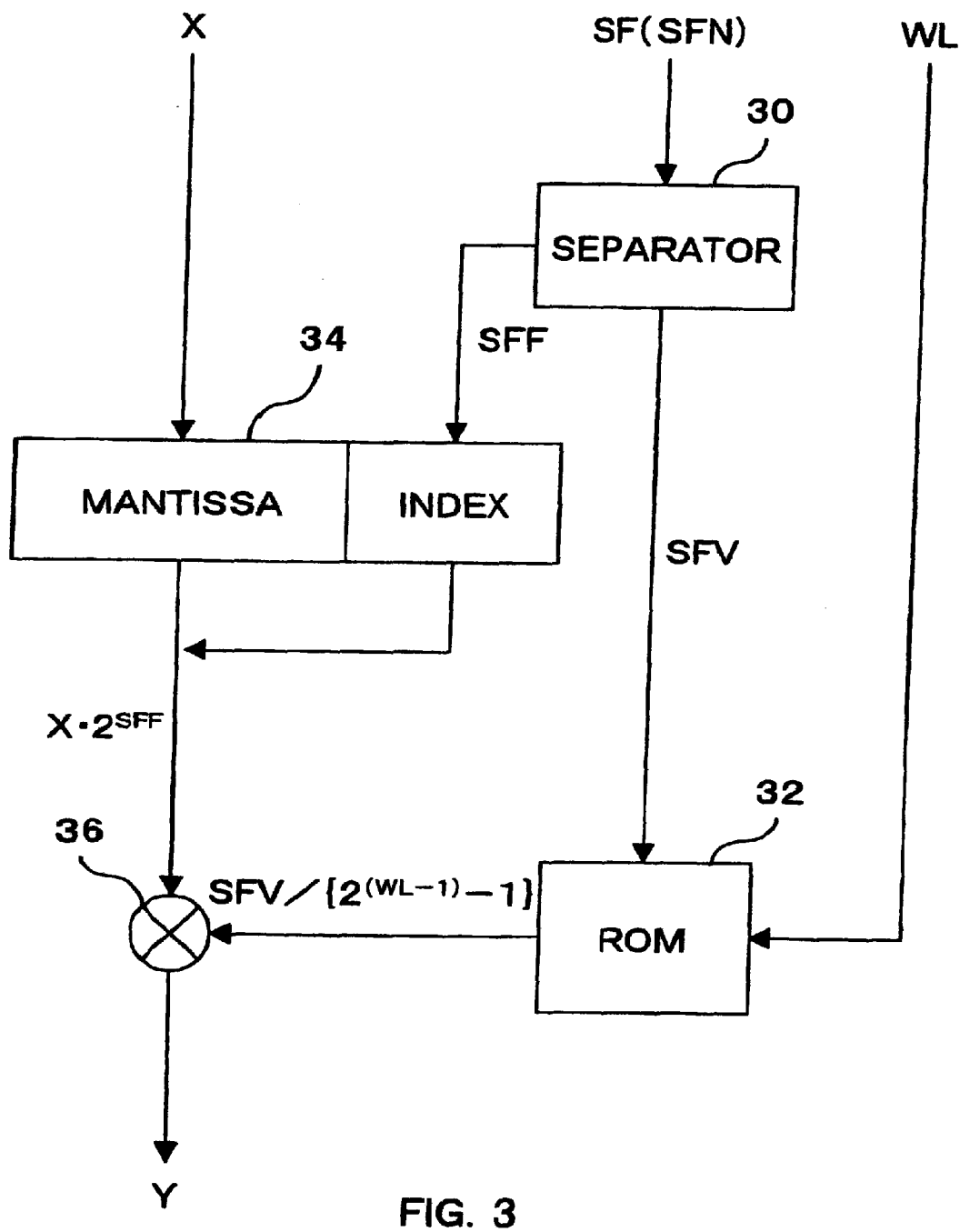
FIG. 3 is a block diagram showing a structure of a decoder according to a third preferred embodiment.

FIG. 3 shows a structure of a decoder according to a third preferred embodiment of the present invention. In this embodiment, output data is represented in the form of floating point data.

Initially, a data value X, a scale factor SF, and a word length WL are input as encoded data. Note that, in this example, SFN will be input here, instead of a scale factor SF. SFN has one-to-one relationship with a scale factor SF as they hold the relationship $SF=2^{(SFNN/3-SF0)}$, SF0 being a predetermined value, such as SF0=0.

The input SFN is supplied to the separator 30 to be divided into a mantissa SFV and an index SFF.

Based on the mantissa value SFv and the word length WL, an access address in the ROM 32 is designated, so that the ROM 32 outputs a value for $SFV/\{2^{(WL-1)}-1\}$.

That is, the ROM 32, which stores data shown in Table 1 in the first embodiment, outputs a corresponding value based on the mantissa value SFV and the word length WL.

On the other hand, the data value X is supplied to a combiner 34, as a first calculator, which also receives an index value SFF from the separator 30. The combiner 34 combines them to output the value $X \cdot 2^{SFF}$.

Then, $SFV/\{2^{(WL-1)}-1\}$, read from the ROM 32, and $X \cdot 2^{SFF}$, read from the combiner 34, are supplied to a multiplier 36, which serves as a second calculator, to perform the following multiplication.

$$X \cdot 2^{SFF} \cdot SFV/\{2^{(WL-1)}-1\} = SF \cdot X/\{2^{(WL-1)}-1\} = Y$$

The multiplier 36 outputs a resultant value Y.

As described above, in this embodiment, the scale factor SF is divided into an index value SFF and the mantissa SFV, and $SFV/\{2^{(WL-1)}-1\}$, which is determined based on the mantissa SFV and a word length WL, is stored in the ROM 32. This arrangement enables reduction of the number of values to be stored in the ROM 32 by number of possible values for SFF, and, thus, the capacity of the ROM 32 may be reduced accordingly. As, there are only three basic mantissa parts SFV, as shown in Table 1, the ROM need not have a large capacity.

Further, when SFF is given as an index part of X, instead of a calculation regarding SFF, the number of multiplications can be reduced to only one, which resultantly enables high-speed calculation by using a simple structure.

Note that, although a value is written from the leftmost bit in the above (e.g., "10101///"), a value may also be written from the rightmost bit (e.g., "///10101"). In that case, $2^{(WL-2)}/\{2^{(WL-1)}-1\}$ may be used in the place of $1/\{2^{(WL-1)}-1\}$, which is a term concerning a word length SL, so that the multiplication made by bit shift according to the word length. With this arrangement, variation of the value of xxx can be reduced, which makes an effective circuit.

Embodiment 4.

In a fourth embodiment of the present invention, output data is represented in the form of a fixed point for the process.

Figure 4:
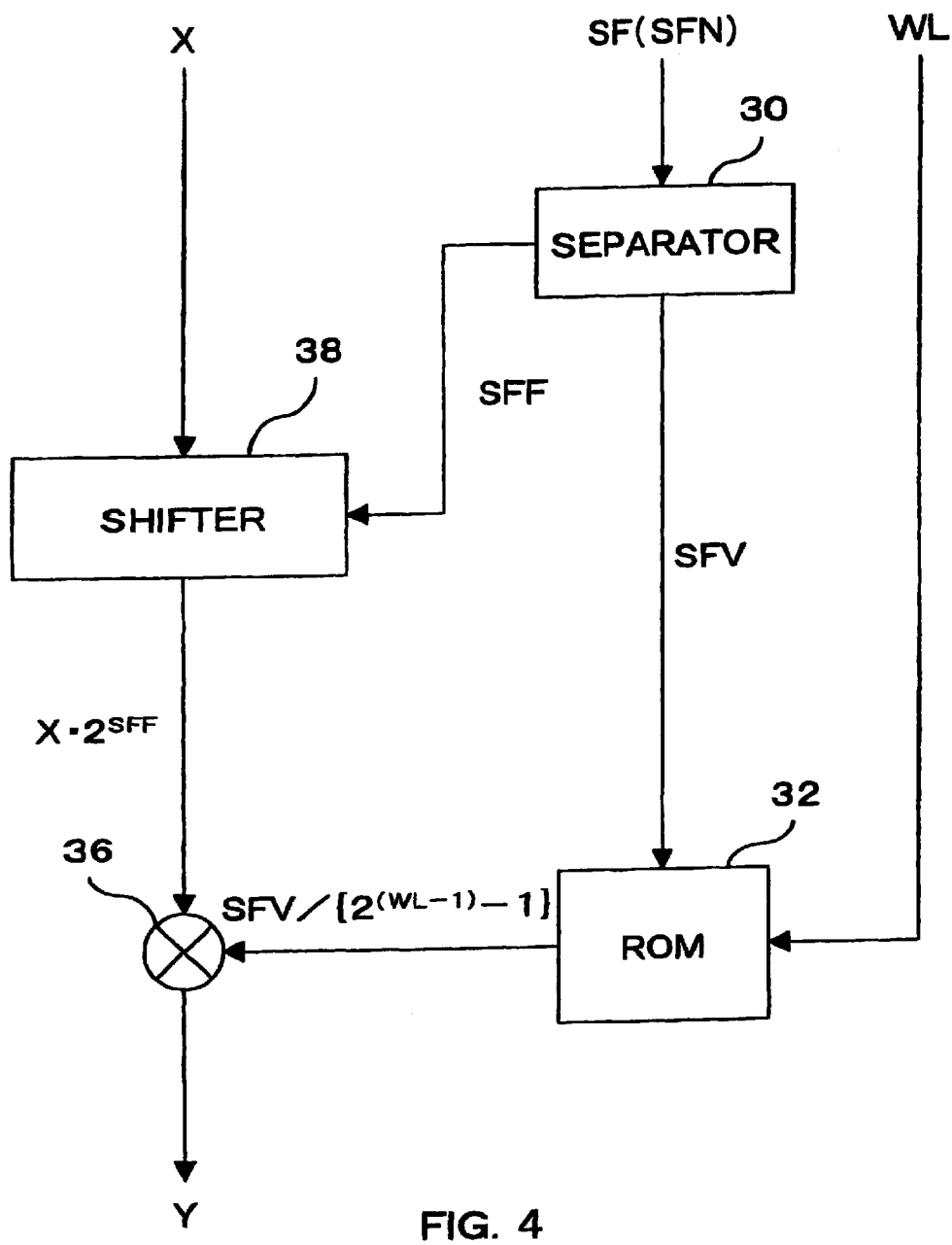
FIG. 4 is a block diagram showing a structure of a decoder according to a fourth preferred embodiment.

In this case, as shown in FIG. 4, a shifter 38 is employed in the place of the combiner 34. The shifter 38 shifts an input data value X according to SFF. That is, multiplication of $2^{SFF}$ with respect to X is achieved by shifting X.

In this embodiment, the capacity of the ROM 32 may be identical to that of the third embodiment, and multiplication need only be carried out once.

As described above, in a decoder of this embodiment, ROM capacity can be reduced and only one multiplication is required when index and mantissa parts of a scale factor SF are handled separately. This enables a simplified circuitry structure and an increased calculation speed.

Other

Recorder-reproducers often have both an encoder and a decoder. In this case, preferably, the encoder and the decoder ay commonly use the same ROM.

What is claimed is:

1. An encoder for separating data Y into a scale factor SF, a word length WL, and a data value X for encoding, comprising:

a separator for separating the scale factor SF into a mantissa value SFV and an index values SFF according to $SF=SFV \cdot 2^{SFF}$;

a ROM for storing a plurality of calculation values obtained according to $\{2^{(WL-1)}-1\}/SFV$ with respect to a plurality of mantissa values SFV and a plurality of word lengths WL;

a first calculator for calculating $Y \cdot 2^{SFF}$ with respect to the data Y and the mantissa value SFV; and a second calculator for obtaining the data value X through multiplication using a calculation value which is read from the ROM according to the scale factor SF and the word length WL which are set with respect to the data Y, and a calculation value obtained by the first calculator.

2. An encoder according to claim 1, wherein the mantissa value SFV includes three values, namely 1, $2^{1/3}$, and $2^{2/3}$, so that $2^{(WL-1)}-1$, $\{2^{(WL-1)}-1\}/2^{1/3}$, and $\{2^{(WL-1)}-1\}/2^{2/3}$ are stored in the ROM.

3. An encoder according to claim 1, wherein the first calculator achieves calculation through bit-shifting of the data Y.

4. A decoder for decoding encoded data to obtain decoded data Y, the encoded data being obtained through separation of data into a scale factor SF, a word length WL, and a data value X, comprising:

a separator for separating the scale factor SF into a mantissa value SFV and an index value SFF according to $SF=SFV \cdot 2^{SFF}$;

a ROM for storing a plurality of calculation values obtained according to $SFV/\{2^{(WL-1)}-1\}$ with respect to a plurality of mantissa values SFV and a plurality of word lengths WL;

a first calculator for calculating $X \cdot 2^{SFF}$ with respect to the data X and the mantissa value SFV; and a second calculator for obtaining the decoded data Y through multiplication using a calculation value read from the ROM according to the scale factor SF and the word length WL inputted, and a calculation value obtained by the first calculator.

5. A decoder according to claim 4, wherein the mantissa value SFV includes three values, namely 1, $2^{1/3}$, and $2^{2/3}$, so that $1/\{2^{(WL-1)}-1\}$, $2^{1/3}/\{2^{(WL-1)}-1\}$, and $2^{2/3}/\{2^{(WL-1)}-1\}$ are stored in the ROM.

6. An encoder according to claim 4, wherein the first calculator achieves calculation by giving an index value to the data value X or by shifting bits of the data value X.

* * * * *

UNITED STATES PATENT AND TRADEMARK OFFICE
CERTIFICATE OF CORRECTION

PATENT NO. : 6,229,461 B1
DATED : May 8, 2001
INVENTOR(S) : Fumiaki Nagao

Page 1 of 1

It is certified that error appears in the above-identified patent and that said Letters Patent is hereby corrected as shown below:

Title page,
Item [75], Inventor, delete "Ibi-gun" and insert therefor -- Gifu --

Column 1,
Line 30, after "wherein" delete "$SF=2^{(SPY/3-SFO)}$" and insert therefor -- $SF=2^{(SFN/3-SF0)}$ --

Column 4,
Line 5, after "relationship" delete "$SF-2^{(SFNN/3-SFO)}$" and insert therefor -- $SF-2^{(SFN/3-SFO)}$ --
Line 9, after "value" delete "SFv" and insert therefor -- SFV --

Signed and Sealed this

Twenty-eighth Day of December, 2004

JON W. DUDAS
*Director of the United States Patent and Trademark Office*